(12) United States Patent
Koch et al.

(10) Patent No.: US 7,285,960 B2
(45) Date of Patent: Oct. 23, 2007

(54) MEASURING DEVICE, AND METHOD FOR LOCATING A PARTIAL DISCHARGE

(75) Inventors: Roland Koch, Ilmenau (DE); Jürgen Weidner, Essen (DE)

(73) Assignee: Siemens Aktiengesellschaft, Munich (DE)

( * ) Notice: Subject to any disclaimer, the term of this patent is extended or adjusted under 35 U.S.C. 154(b) by 67 days.

(21) Appl. No.: 10/556,015

(22) PCT Filed: Apr. 19, 2004

(86) PCT No.: PCT/EP2004/004147

§ 371 (c)(1),
(2), (4) Date: Nov. 8, 2005

(87) PCT Pub. No.: WO2004/099800

PCT Pub. Date: Nov. 18, 2004

(65) Prior Publication Data

US 2007/0057677 A1    Mar. 15, 2007

(30) Foreign Application Priority Data

May 9, 2003    (DE) ............................ 103 21 085

(51) Int. Cl.
*G01R 31/12*    (2006.01)
(52) U.S. Cl. .................................... 324/536
(58) Field of Classification Search ................ None
See application file for complete search history.

(56) References Cited

U.S. PATENT DOCUMENTS

| 4,550,288 | A | * | 10/1985 | Schweitzer, Jr. ............ 324/133 |
| 4,570,231 | A |   | 2/1986  | Bunch |
| 4,949,001 | A | * | 8/1990  | Campbell .................... 310/220 |
| 5,416,418 | A | * | 5/1995  | Maureira et al. ........... 324/535 |
| 5,530,364 | A |   | 6/1996  | Mashikian et al. |
| 5,814,998 | A |   | 9/1998  | Gruenewald et al. |

(Continued)

FOREIGN PATENT DOCUMENTS

DE    689 22 727 T2    1/1991

(Continued)

OTHER PUBLICATIONS

Yong-Joo Kim, Dong-Sik Kang, Don-Ha Hwang, Doh-Young Park; "A Partial Discharge Coupler for Global VPI (CGVPI) Rotating Machines"; Conference Record of the 2002 IEEE International Symposium on Electrical Insulation; Apr. 7-10, 2002; pp. 19-22; Boston, MA.

(Continued)

*Primary Examiner*—Vincent Q. Nguyen

(57) ABSTRACT

A device and a method for locating partial discharges in a conductor rod of a dynamo-electric machine are provided, the conductor rod being provided with an exterior electrical insulation. A first and a second sensor are embodied so as to detect a signal which is generated by the partial discharge and spreads along the conductor rod. The first and second sensor are disposed at a distance from each other on the conductor rod in order to emit a partial discharge output signal that represents a specific moment of detection. The partial discharge output signals of the first and second sensor are fed to an evaluation unit which is embodied so as to locate the partial discharge on the conductor rod.

7 Claims, 5 Drawing Sheets

U.S. PATENT DOCUMENTS

| | | | |
|---|---|---|---|
| 5,903,158 A | * | 5/1999 | Eriksson et al. ............ 324/536 |
| 2002/0014890 A1 | | 2/2002 | Cooke |

FOREIGN PATENT DOCUMENTS

| | | |
|---|---|---|
| DE | 197 58 087 A1 | 7/1999 |
| DE | 199 62 834 A1 | 1/2001 |
| DE | 100 05 540 A1 | 8/2001 |
| EP | 0 408 813 A1 | 1/1991 |
| EP | 0 805 355 A2 | 11/1997 |
| WO | WO 00/42444 | 7/2000 |

OTHER PUBLICATIONS

H.G. Sedding, S.R. Campbell, G.C. Stone, G.S. Klempner; "A New Sensor for Detecting Partial Discharges in Operating Turbine Generators"; IEEE Transactions on Energy Conversion; Dec. 1991; pp. 700-706; vol. 6 No. 4; Ontario Hydro; Toronto, Canada.

* cited by examiner

MEASURING DEVICE, AND METHOD FOR LOCATING A PARTIAL DISCHARGE

CROSS REFERENCE TO RELATED APPLICATION

This application is the US National Stage of International Application No. PCT/EP2004/004147, filed Apr. 19, 2004 and claims the benefit thereof. The International Application claims the benefits of German Patent application No. 103 21 085.7 DE filed May 9, 2003, both of the applications are incorporated by reference herein in their entirety.

FIELD OF THE INVENTION

The invention relates to a measuring device and to a method for locating a partial discharge in a conductor bar, which has electrical external insulation, in a dynamoelectrical machine, as well as to a sensor for determination of partial discharges.

BACKGROUND OF THE INVENTION

Owing to the incipient changes in the electricity market as well as those which are also to be expected in the near future, cost-optimized and interruption-free generation and distribution of electrical power is desirable for power supply organizations. Generators are of particular importance in this context, whose failure results in high financial costs, so that there is a growing interest in improving the operational reliability.

Motors, generators and the like typically have a rotor which is mounted in a stator core such as it can rotate. The stator core has stator windings which are composed of insulated bundles of conductors, which are known as stator bars and are embedded in slots in the stator core.

The high-voltage conductors are generally insulated. The insulation which surrounds such high-voltage conductors deteriorates over time. Deterioration in the insulation and in the characteristics of the insulation can result in partial discharge activity within the insulation. This discharge activity causes further deterioration in the characteristics of the insulation. Damage can occur as a result of locally limited breakdowns resulting from field strength peaks in the insulating medium. In the long term, these breakdowns damage the insulation. Increasing deterioration of the insulation leads to increasing partial discharge activity, which in turn speeds up the deterioration of the insulation.

An insulated conductor which has been subject to partial discharge activity may need to be replaced in order to prevent or to rectify a fault or failure in the stator winding system. In this case, the motor or generator must be shut down and must be disassembled. This is a costly and time-consuming process. It is thus advantageous to have the capability to determine the state of the insulation in the stator windings in advance in order to predict whether and approximately when repair will become necessary, so that the repair can be carried out in a ordered and well-organized manner, before the fault or the malfunction becomes evident, and at a time which is most suitable with respect to the operating plan of the specific motor or generator which is affected.

Partial discharge activities can be detected by various methods, in particular by chemical, acoustic or electrical methods. In the case of physically extended conductors, such as those which are used in generators and motors, partial discharge pulses are highly deformed on their path from the point of origin to the measurement point, are attenuated and have reflected partial discharge signals as well as external interference signals superimposed on them, so that the partial discharge source can be located, and the partial discharges and interference signals can be separated only in rare cases and with major measurement and computation complexity.

The detection and assessment of partial discharges on physically extended arrangements such as generators or similar high-voltage appliances is frequently associated with major difficulties because of the deformation of the partial discharge signals as a result of the characteristic attenuation properties and the superimposition of external interference signals.

One method for locating partial discharges is described in the article "Ein neuartiges Sensorsystem zur Erfassung von Teilentladungen an gießharzisolierten Transformatoren" [A novel sensor system for detecting partial discharges in transformers with cast resin insulation], Peter Werle, Volker Wasserberg, Hossein Borsi, Ernst Gockenbach, Schering Institute for High Voltage Technology and High-Voltage Installations, Hanover University, Germany. According to this document, sensors which are designed to detect partial discharge signals are distributed at equidistant intervals on a conductor. A partial discharge propagates from its point of origin in both directions of the conductor bar. Those sensors which are arranged closest to the point of origin of the partial discharge detect the strongest signal. In this case, the location of a partial discharge can be determined by means of an evaluation unit which is connected to all of the sensors. This method has the disadvantage that, rather than determining the precise location of the partial discharge, it determines a region between two sensors as the possible point of origin of a partial discharge.

A further method for locating partial discharges in transformers and similar high-voltage appliances is described in DE 100 05 540 A1. In this case, the partial discharge source can be located based on a system theory by convolution of a transfer function and partial discharge signals measured at external terminals. This is done by determining the best match between the back-calculated input signals and the partial discharge signal that is produced at the true point of origin.

DE 689 22 727 T4 discloses a further method and an apparatus for partial discharge detection. In this case, a sensor is used to detect a signal which is caused by a partial discharge. The point of origin of a partial discharge is located with a relatively high error probability by analysis of the signal.

Further methods and apparatuses for partial discharge identification are described in DE 197 58 087 A1 and in DE 199 62 834 A1.

SUMMARY OF THE INVENTION

The invention is based on the object of specifying a measuring device and a method, by means of which it is possible to locate a partial discharge in a conductor bar which has electrical external insulation. A further object of the invention is to specify a sensor by means of which partial discharges can be determined.

The object relating to the measuring device is achieved by a measuring device for locating a partial discharge on a conductor bar, which has electrical external insulation, in a dynamoelectrical machine, in which a first sensor and a second sensor, which are designed to detect signals which are caused by the partial discharge and propagate along the conductor bar, with the first sensor being designed to emit a first partial discharge output signal, which reflects a first detection time and is applied to the first sensor and with the second sensor being designed to emit a second partial discharge output signal, which reflects a second detection time and is applied to the second sensor are arranged at a distance from one another on the conductor bar. The first partial discharge output signal and the second partial discharge output signal are in this case supplied to an evaluation unit, which is designed to locate the partial discharge on the conductor bar.

The advantage of the measuring device is, in particular, that the location is determined by a delay time measurement. A partial discharge signal is produced at the point of origin of the partial discharge and propagates in both directions of the conductor bar. The propagating signal is detected by the first sensor and the second sensor. The point of origin of the partial discharge is determined by means of a delay time measurement. This measuring device is largely independent of the form of the partial discharge signal. In conventional partial discharge location methods, the signal forms are generally evaluated, and are used to determine the point of origin. The results of these methods are subject to high error rates. The measuring device according to the invention does not evaluate the form of the signal which is caused by the partial discharge but the time of arrival of the signal caused by the partial discharge at the first sensor or at the second sensor.

In this case, it is possible to locate more accurately partial discharge sources on individual conductor bars, molded coils or stator windings that partial discharges determine by means of attenuation comparison.

Since no mechanical scanning of the conductor bar is required, the measurement times are shorter than in the case of measurements using ultrasound sensors.

Inter alia, this allows progress to be achieved in the quality control of entirely impregnated generators.

The conductor bars can be investigated for local weaknesses. It is thus possible to assess relatively old conductor bars for possible reuse in new generators. In addition, it is possible to predict the remaining life of relatively old conductor bars. A further advantage is that it is possible to locate a partial discharge source within a single slot.

The first sensor or second sensor can be fitted directly to the conductor bar, so that the first or the second partial discharge output signal is not deformed by long propagation paths (a plurality of slots, end winding, section connectors and bushings). This allows more accurate location.

Quick and safe removal of the first or second sensor is likewise possible.

In one advantageous refinement, the evaluation unit has a time difference module TDM with a first time difference signal input, a second time difference signal input and a time difference output. The first partial discharge output signal is applied to the first time difference signal input, and the second partial discharge output signal is applied to the second time difference signal input. The evaluation unit is designed such that the time difference between the arrival of the first partial discharge output signal from the first sensor at the time difference module and the arrival of the partial discharge output signal from the second sensor at the time difference module is determined, and is produced as the time difference output signal at the time difference output. The evaluation unit 5 has, in this case, a calculation module CM with a calculation input to which the time difference output signal is applied, and which is designed such that a partial discharge location value is calculated, which indicates the point of origin of the partial discharge on the conductor bar.

The partial discharge location value is advantageously determined in the evaluation unit using the equation $l1=(l+vDt)/2$ where l is the distance between the first sensor and the second sensor, l1 is the distance between the point of origin of the partial discharge and the second sensor, v is the propagation speed of the partial discharge, and Dt is the time difference.

Based on the measure of the partial discharge location value being determined using the abovementioned equation, a measuring device is proposed which has only one parameter which is determined during a measurement method.

The measuring device can be used in a generator or in a transformer.

In advantageous embodiments of the invention, the first sensor or second sensor acts as a capacitive sensor; the first sensor or second sensor acts as an inductive sensor; the first sensor or second sensor acts as a direct-axis voltage sensor.

In general, inductive sensors record a magnetic component of transverse electromagnetic waves which propagate around the conductor bar. Capacitive sensors record an electrical component of transverse electromagnetic waves. Direct-axis voltage sensors record a voltage which is dropped in a high-impedance conductive layer (external corona-discharge protection) as a result of a current in an electromagnetic wave.

The object relating to the method is achieved by a method for detecting and locating a partial discharge in a conductor bar which has electrical external insulation, in a dynamo-electrical machine in which a first sensor and a second sensor are fitted to the conductor bar (3) at a distance (1) from one another in order to detect signals which are caused by the partial discharge and propagate along the conductor bar (3), the first sensor (5) supplies a first partial discharge output signal (42) to an evaluation unit (44) and the second sensor (6) supplies a second partial discharge output signal (43) to the evaluation unit (44), and the evaluation unit (44) uses the distance (1) and the time of arrival of the first partial discharge output signal (42) and of the second partial discharge output signal (43) to determine the point of origin (7) of the partial discharge.

The advantages that result in this case are the same as those already mentioned for the measuring device.

The object relating to the sensor is achieved by a sensor for determination of partial discharges, in which an electrically conductive electrode which is in the form of a sheet and has a front face and a rear face, is designed with external insulation being applied to the front face and a coaxial cable, which is in the form of a connection, being arranged on the electrode, with a dielectric being attached to the rear face of the electrode, and with a shielding electrode being attached to the dielectric by means of a transfer adhesive.

The advantage of the sensor is, in particular, that signals from the partial discharges can be recorded clearly and without being corrupted. Furthermore, the sensor is designed such that it can be fitted at points where access is difficult.

In one advantageous refinement, the electrode is produced from an elastic material. This avoids the risk of the sensor fracturing.

In a further advantageous refinement, the electrode is produced from rolled copper adhesive film. The deliberate choice of rolled copper adhesive film minimizes the physical size. Furthermore, a rolled copper adhesive film is elastic, thus minimizing destruction of the sensor as a result of fracturing.

In one advantageous refinement, the electrode is formed from a layer assembly composed of polyimide and rolled copper. The deliberate choice of polyimide and rolled copper likewise influences the size of the sensor. This allows the size of the sensor to be minimized. Furthermore, the layer assembly composed of polyimide and rolled copper is an elastic material, thus minimizing the risk of the electrode fracturing.

In a further advantageous refinement, the external insulation is composed of the materials high-density polyethylene or polypropylene. High-density polyethylene or polypropylene provide materials which are crack-resistant and are extremely thin. This increases the life of the sensor.

In one advantageous refinement, the dielectric is formed from a closed-pore polyethylene foam which is free of fluoro-chlorohydrocarbons. The choice of closed-pore polyethylene foam which is free of fluoro-chlorohydrocarbons results in a material being proposed to which external forces can be applied in the installed state. The polyethylene foam is elastic and can be stretched or compressed in different directions without the polyethylene foam losing its properties as a dielectric.

In a further advantageous refinement, the shielding electrode has a copper-coated glass-fiber epoxy resin. Copper-coated glass-fiber epoxy resin is flexible, and has good electrical conductivity at the same time. The use of this material as a shielding electrode in a sensor which is subject to external forces in the installed state is virtually ideal.

The shielding electrode expediently has a thickness of 0.30 mm to 0.60 mm, substantially 0.48 mm.

In order to increase the measurement accuracy, the electrode is in two parts. The sensor is used as an inductive, capacitive or direct-access voltage sensor.

BRIEF DESCRIPTION OF THE DRAWINGS

Exemplary embodiments of the invention will be described with reference to the description and the figures. In this case, components which are provided with the same reference symbols operate in the same way.

In this case.

DETAILED DESCRIPTION OF THE INVENTION

Figure 1:
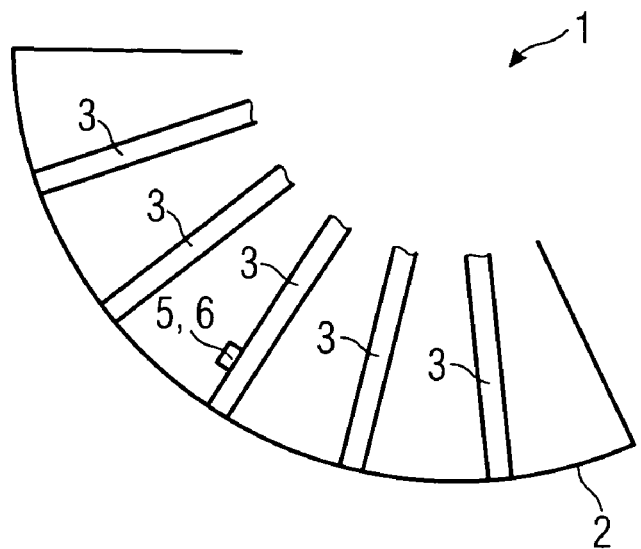
FIG. 1 shows a highly simplified detail of a stator housing of a generator.

FIG. 1 shows a highly simplified detail of a dynamoelectrical machine 1. The expression a dynamoelectrical machine means a transformer or a generator. A rotor, which is not illustrated, rotates about a rotation axis in a stator housing 2. Conductor bars 3 having external electrical insulation are installed in the stator housing 2. A sensor 5, 6 is fitted to one end of the conductor bar 3.

Figure 2:
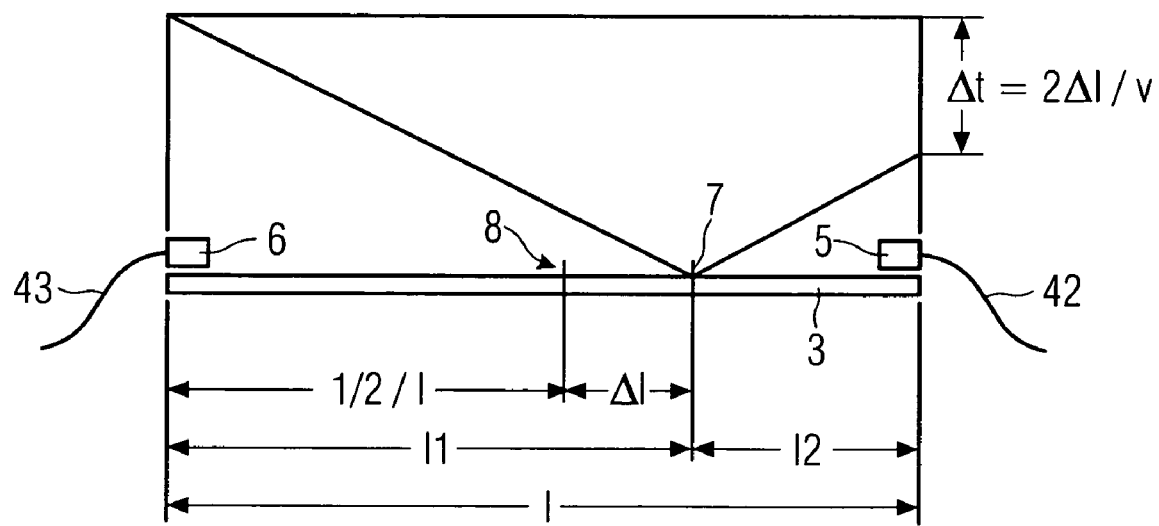
FIG. 2 shows an illustration of a measurement principal.

FIG. 2 illustrates a highly simplified measurement arrangement. A first sensor 5 and a second sensor 6 are fitted to one surface of the conductor bar 3. The first sensor 5 and the second sensor 6 are designed to detect signals which are caused by the partial discharge and propagate along the conductor bar 3. The first sensor 5 is designed to emit a first partial discharge output signal 42, which reflects a first detection time and is applied to the first sensor 5. The second sensor 6 is designed to emit a second partial discharge output signal 43 which reflects a second detection time and is applied to the second sensor 6. A partial discharge occurs at the point of origin 7 on the conductor bar 3 as a result of damaged insulation. The partial discharge propagates as a signal on the one hand in the direction of the first sensor 5 and on the other hand in the direction of the second sensor 6. The first sensor 5 and second sensor 6 are fitted to the conductor bar 3 at a distance l from one another.

The first partial discharge output signal 42 and the second partial discharge output signal 43 are supplied to an evaluation unit 44, which is not illustrated in any more detail in FIG. 2. The evaluation unit 44 is designed to locate the partial discharge on the conductor bar 3.

Figure 11:
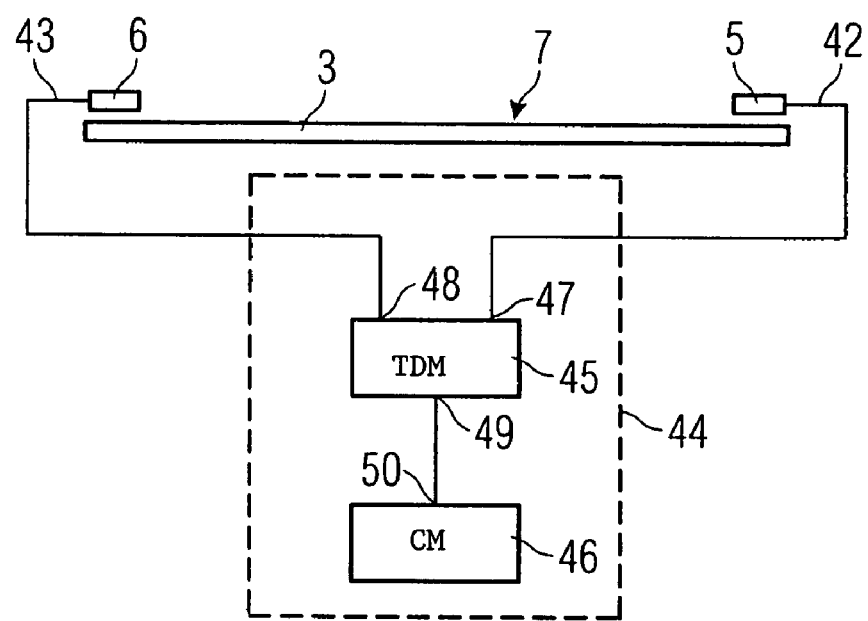
FIG. 11 shows an illustration of a measuring device and of an evaluation unit.

FIG. 11 shows an illustration of the measuring device and of the evaluation unit 44. The evaluation unit 44 has a time difference module 45 with a first time difference signal input 47, a second time difference signal input 48 and a time difference output 49. The first partial discharge output signal 42 is applied to the first time difference signal input 47, and the second partial discharge output signal 43 is applied to the second time difference signal input 48.

The evaluation unit 44 determines the time difference between the arrival of a first partial discharge output signal 42 from the first sensor 5 at the time differencing module 45, and the arrival of the second partial discharge output signal 43 from the second sensor 6 at the time differencing module 45. The value of the time difference is produced as the time difference output signal at the time difference output 49.

The evaluation unit 44 has a calculation module 46 with a calculation input 50. The time difference output signal is applied to the calculation input 50. A partial discharge location value is calculated in the calculation module 46, indicating the point of origin 7 of the partial discharge on the conductor bar 3.

As illustrated in FIG. 2, the centre 8 of the conductor bar 3 is at a distance of precisely $\frac{1}{2}l$ from the first sensor 5 and from the second sensor 6. In the exemplary embodiment illustrated in FIG. 2, the point of origin 7 of the partial discharge is separated from the first sensor 5 by the length $l2$, and from the second sensor 6 by the length $l1$. The distance between the point of origin 7 of the partial discharge and the centre 8 of the conductor bar 3 is D1.

The following equation thus applies: $D1 = l1 - \frac{1}{2} = \frac{1}{2} - l2$.

A partial discharge signal which is produced at the point of origin 7 and propagates in the direction of the first sensor 5 and of the second sensor 6 arrives at the second sensor 6, which is further away, later, by the time difference $$Dt = t1 - t2 = 2D1/v$$

than at the first sensor 5, assuming that the propagation speed v is constant.

The distance $l1$ between the point of origin 7 and the second sensor 6 is then:

$$l1 = (l + v \times (t1 - t2))/2.$$

The partial discharge which occurs at the point of origin 7 is generally located in the slot area of a stator winding.

Figure 3:
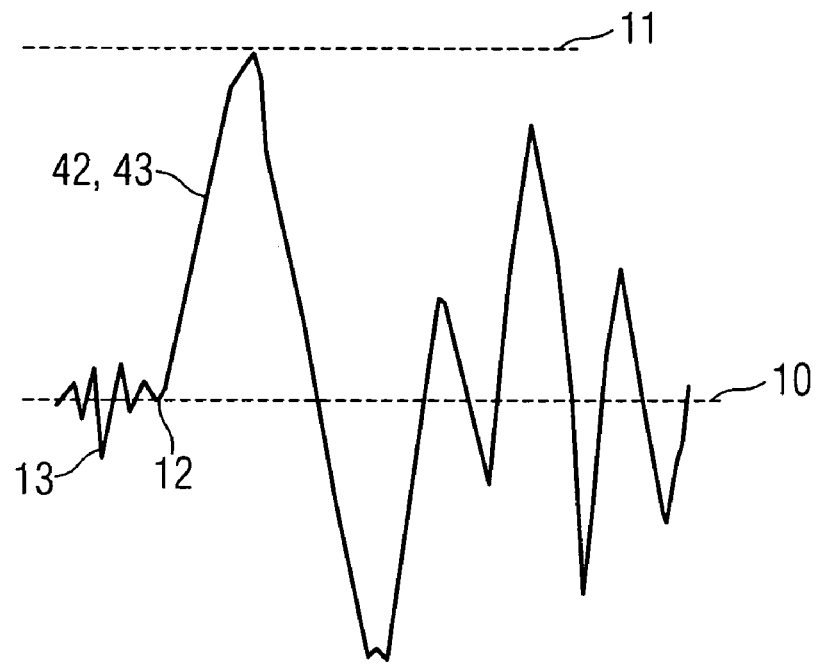
FIG. 3 shows an illustration of a detected signal.

A suitable time-measurement method is important for the measurement method. The time measurement can be carried out digitally. By way of example, FIG. 3 shows the first partial discharge output signal 42 detected by the first sensor 5, or the second partial discharge output signal 43 detected by the second sensor 6. The X-coordinate 10 which is indicated in arbitrary units by a dashed line should be regarded as the time axis. The amplitude of the first partial discharge output signal 42 or of the second partial discharge output signal 43 is shown on a Y axis, which is not illustrated. The illustration of the first partial discharge output signal 42 or of the second partial discharge output signal 43 on the Y coordinate is plotted in arbitrary units. In addition to the first partial discharge output signal 42 or the second partial discharge output signal 43, a maximum value 11 is represented by a dashed line.

Figure 4:
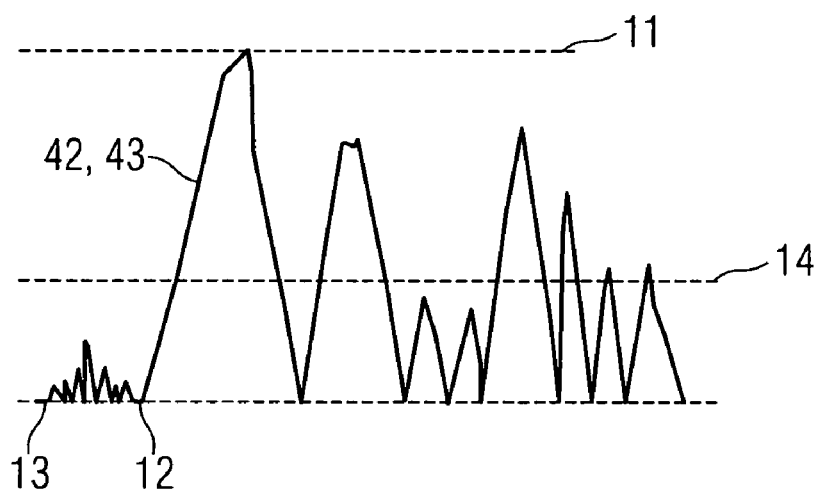
FIG. 4 shows an illustration of an evaluated signal.

FIG. 4 shows the magnitude of the partial discharge output signals 42, 43, as illustrated in FIG. 3 on an X, Y representation.

Any oscillatory behavior of the first partial discharge output signal 42 or of the second partial discharge output signal 43 can be taken into account by evaluation of the magnitude of the first partial discharge output signal 42 or of the second partial discharge output signal 43.

The arrival time 12 should be understood as meaning the time of arrival of the signal which is caused by partial discharge at the first sensor 5 or at the second sensor 6. The representation of the magnitude of the first partial discharge output signal 42 or of the second partial discharge output signal 43 allows signal noise 13 to be clearly separated from the first partial discharge output signal 42 or the second partial discharge output signal 43.

20% of the maximum value 11 is represented by a 20% auxiliary line 14. The first partial discharge output signal 42 or the second partial discharge output signal 43 is assessed as a useable signal only when above the 20% auxiliary line.

The definition of the 20% auxiliary line makes the measuring device largely independent of any background noise on the signal which is caused by the partial discharge.

Figure 5:
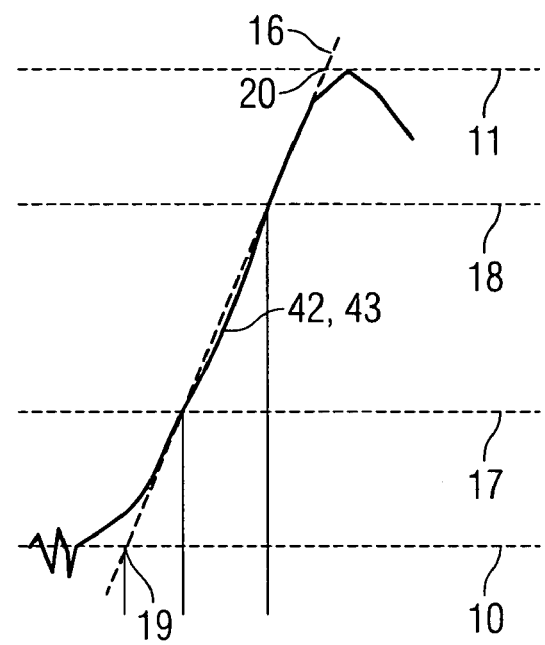
FIG. 5 shows an illustration of a part of a signal.

FIG. 5 illustrates a part of the first partial discharge output signal 42 or of the second partial discharge output signal 43.30% of the maximum value 11 is represented by a 30% auxiliary line 16.70% of the maximum value 11 is represented by a 70% auxiliary line 17. The profile of the first partial discharge output signal 42 or of the second partial discharge output signal 43 from a minimum value 19 to a maximum value 11 is represented by an auxiliary tangent 16. The auxiliary tangent 16 is defined by a straight line, which is defined by a first intersection 51, formed by an intersection between the first partial discharge output signal 42 or the second partial discharge output signal 43 and the 70% auxiliary line 18, and a second intersection 52, formed by an intersection between the first partial discharge output signal 42 or the second partial discharge output signal 43 and the 30% auxiliary line 17.

Figure 6:
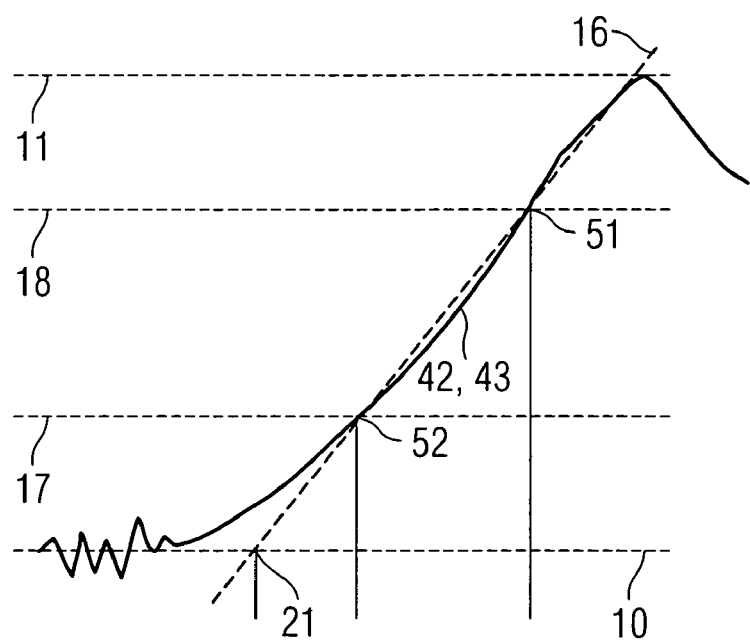
FIG. 6 shows an illustration of a part of a second signal.

FIG. 6 illustrates a different time response of the first partial discharge output signal 42 or of the second partial discharge output signal 43. If the rise in the first partial discharge output signal 42 or in the second partial discharge output signal 43 is relatively flat, it is in some circumstances difficult to determine the precise arrival of the signal which is caused by the partial discharge. In this case, it is not possible to state precisely when the signal arrives. The auxiliary tangent 16 intersects the X coordinate 10 at the auxiliary arrival time 21. The auxiliary arrival time 21 can be defined as the time of arrival of the signal which is caused by the partial discharge. The introduction of the 30% auxiliary line and of the 70% auxiliary line, as well as the auxiliary tangent 16, takes account of the flat rise, as illustrated in FIG. 6, of the first partial discharge output signal 42 or of the second partial discharge output signal 43, thus improving the measurement accuracy. It is thus possible to distinguish between distinctive partial discharge pulses and normal age-dependent partial discharges.

The first sensor 5 or the second sensor 6 is fitted to the conductor bar 3 as a capacitively acting sensor, an inductively acting sensor or as a sensor which acts as a direct-axis voltage sensor.

The measuring device can be used in a generator or in a transformer.

Figure 7:
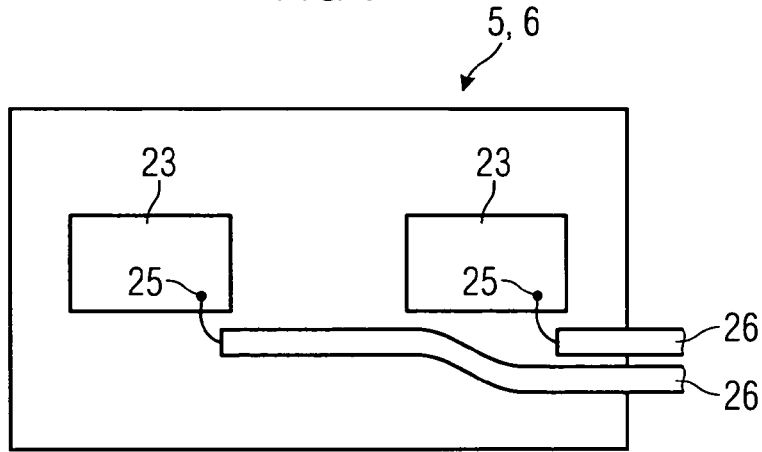
FIG. 7 shows a plan view of a sensor.
Figure 8:
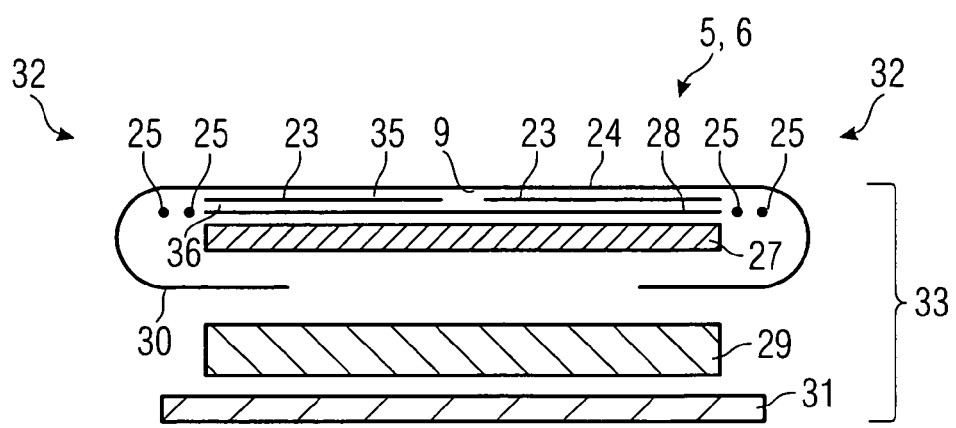
FIG. 8 shows a section through a sensor.
Figure 9:
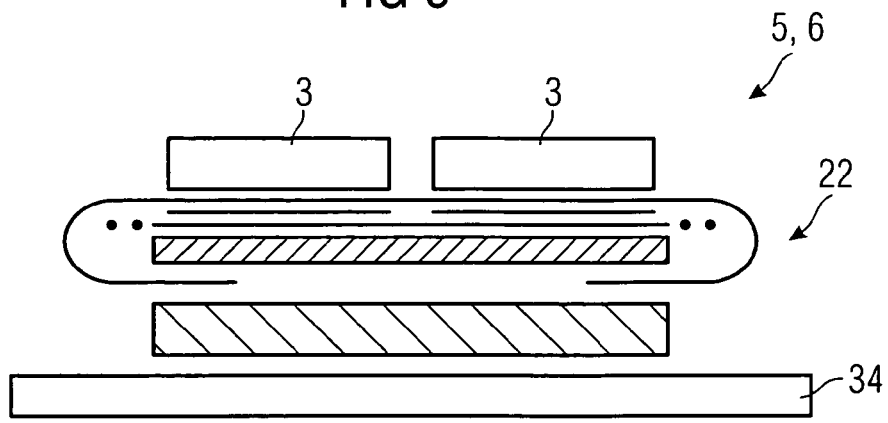
FIG. 9 shows a section through a sensor in the installed state.

FIGS. 7, 8 and 9 show the design of the first sensor 5 or of the second sensor 6. FIG. 7 shows a plan view of the first sensor 5 or of the second sensor 6. As is illustrated in FIG. 8, an electrically conductive electrode 23 which is in the form of a sheet is connected by a front face 35 and a rear face 36 to external insulation 24 on the front face 35. The electrode 23 is connected to coaxial cables 26 via connections 25. The first sensor 5 or the second sensor 6 which is illustrated in FIG. 7 is designed with a total of four electrodes 23.

FIG. 8 shows a section through the first sensor 5 or the second sensor 6. The electrode 23 is connected to external insulation 24, in order to avoid ground loops between the sensors 5, 6 and a high voltage installation. A dielectric 27, which is produced from non-conductive elastic material, is connected by means of a transfer adhesive 28 on the rear face 36 of the electrode 23. A further dielectric 29 is applied to a lower face 30 of the first sensor 5 or of the second sensor 6.

A shielding electrode 31 is fitted to the further dielectric 29. In an alternative embodiment, the electrode 23 is produced from an elastic material. In a further alternative embodiment, the electrode is produced from rolled copper adhesive film.

Commercially available adhesive film (trade name, for example, TESA) has been proven for use as the external insulation 24. Adhesive packing tape is not sufficiently resistant to tearing transversely with respect to the winding direction, while PVC insulating tape has an excessively rough and sticky surface because of the softener content.

Instead of covering the electrode 23 with adhesive film, electrodes 23 composed of rolled copper adhesive film can be adhesively bonded to an inner face 9 of the external insulation 24. High-density polyethylene (HD-PE) or polypropylene (PP) are suitable for use as materials. PET film (standard designation: F1515, trade name: Hostapan) is suitable owing to the deformability of the smooth surface and the adhesion of the rolled copper adhesive film. The connections 25 are soldered to the electrode 23.

A closed-pore PE foam which is free of fluoro-chlorohydrocarbons and is commercially available as a cushioning material for packaging and damping of walking noise is used as the dielectric 27. The coaxial cables 26 are firmly adhesively bonded to one edge 32 of the dielectric 27, under the folded-over external insulation 24, by means of transfer adhesive 28. The shielding electrode 31 is produced from copper-coated glass-fiber epoxy resin with a thickness of 0.40 mm to 0.60 mm, preferably 0.48 mm. An overall thickness 33 of the first sensor 5 or of the second sensor 6 can be matched to the distance between the conductor bar 3 and a pressure finger 34 by means of a further intermediate layer composed of an additional dielectric, which is not illustrated in any more detail.

In an alternative embodiment, the electrode 23 is produced from polyimide and rolled copper.

The electrode 23 illustrated in FIG. 8 and FIG. 9 is in two parts.

Figure 10:
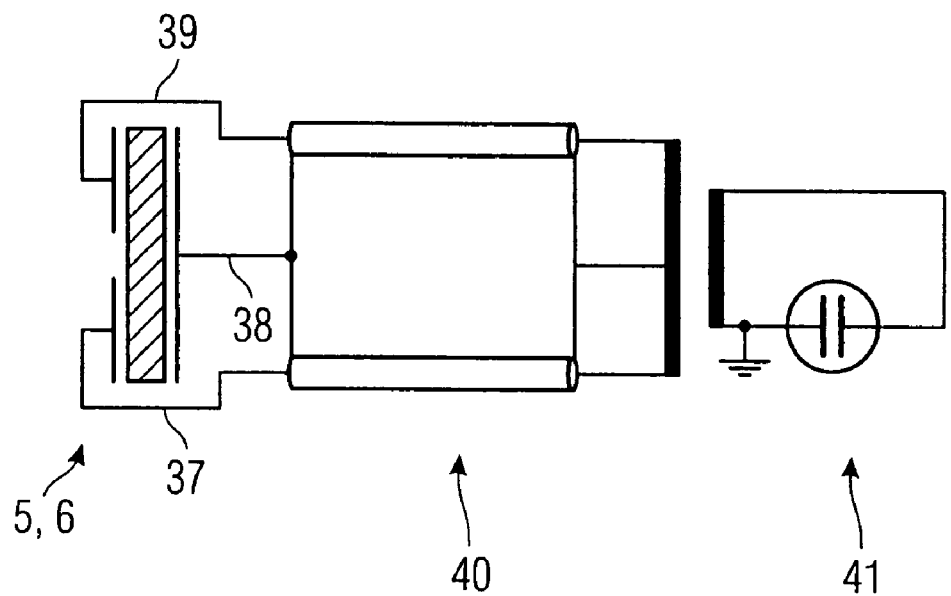
FIG. 10 shows an illustration of a measurement arrangement.

FIG. 10 shows a measurement principle. The first sensor 5 or the second sensor 6 is coupled to a balanced transformer 11 via three lines 37, 38, 39. The balanced transformer 11 is also known by the expression "balanced unbalanced transformer", or "balun" for short. A detection unit 41 for representation and outputting of the first partial discharge output signal 42 or of the second partial discharge output signal 43 is coupled to the balanced transformer 11.

In the case of capacitive sensors and direct-axis voltage sensors, care must be taken to ensure a low dielectric constant. Either the dielectric 27 of appropriate thickness or the further dielectric 29 is used in order to match the overall thickness 33 of the first sensor 5 or of the second sensor 6 to a gap width.

The first sensor 5 or the second sensor 6 can also be used as a multiple sensor. A plurality of sensors may be arranged on one conductor bar 3, corresponding to the number of conductor bars 3 in one slot.

The invention claimed is:

1. A measuring device for locating a partial discharge on a conductor bar that has electrical external insulation in a dynamo-electrical machine, comprising:
   - a first sensor that is designed to detect signals that are caused by the partial discharge and propagating along the conductor bar with the first sensor being designed to emit a first partial discharge output signal that reflects a first detection time and is applied to the first sensor; and
   - a second sensor that is designed to detect signals that are caused by the partial discharge and propagating along the conductor bar with the second sensor being designed to emit a second partial discharge output signal that reflects a second detection time and is applied to the second sensor and the second sensor arranged at a distance from the first sensor on the conductor bar,
   - whereby the first partial discharge output signal and the second partial discharge output signal are supplied to an evaluation unit which is designed to locate the partial discharge on the conductor bar;
   wherein the evaluation unit has a time difference module with a first time difference signal input, a second time difference signal input and a time difference output, with the first partial discharge output signal being applied to the first time difference signal input, and the second partial discharge output signal being applied to the second time difference signal input with the evaluation unit being designed such that a time difference between the arrival of the first partial discharge output signal from the first sensor at the time difference module and the arrival of the second partial discharge output signal from the second sensor at the time difference module is determined and is produced as the time difference output signal at the time difference output with the evaluation unit having a calculation module with a calculation input to which the time difference output signal is applied, and which is designed such that a partial discharge location value is calculated, which indicates the point of origin of the partial discharge on the conductor bar.

2. The measuring device as claimed in claim 1, wherein the evaluation unit is designed to determine a partial discharge location value using the equation $l1=(l+v\ Dt)/2$ where l is a distance between the first sensor and the second sensor, l1 is a distance between a point of origin of the partial discharge and a centre between the first sensor and the second sensor, v is a propagation speed of the partial discharge, and Dt is a time difference.

3. The measuring device as claimed in claim 1, wherein the first sensor or the second sensor is a capacitively acting sensor.

4. The measuring device as claimed in claim 1, wherein the first sensor or the second sensor is an inductively acting sensor.

5. The measuring device as claimed in claim 1, wherein the first sensor or the second sensor is a direct-axis voltage sensor.

6. The measuring device as claimed in claim 1, wherein the measuring device is arranged to be used in a generator.

7. The measuring device as claimed in claim 1, wherein the measuring device is arranged to be used in a transformer.

* * * * *